(12) United States Patent
Usami et al.

(10) Patent No.: US 8,598,044 B2
(45) Date of Patent: Dec. 3, 2013

(54) METHOD OF FABRICATING A SEMICONDUCTOR DEVICE

(75) Inventors: Tatsuya Usami, Kawasaki (JP); Sadayuki Ohnishi, Kawasaki (JP); Masayuki Hiroi, Kawasaki (JP); Akira Matsumoto, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 1695 days.

(21) Appl. No.: 11/156,735

(22) Filed: Jun. 21, 2005

(65) Prior Publication Data

US 2006/0216946 A1 Sep. 28, 2006

(30) Foreign Application Priority Data

Mar. 25, 2005 (JP) ................................. 2005-089794

(51) Int. Cl.
*H01L 21/302* (2006.01)

(52) U.S. Cl.
USPC ........... 438/738; 438/736; 438/737; 438/763; 438/780; 257/E21.023

(58) Field of Classification Search
USPC ......... 438/763, 790, 689, 734, 735, 736, 737, 438/738, 743, 744, 761, 778, 780, 787, 789, 438/793, 794; 257/E21.023, E21.024
See application file for complete search history.

(56) References Cited

U.S. PATENT DOCUMENTS

| | | | | |
|---|---|---|---|---|
| 5,342,481 A * | 8/1994 | Kadomura | ...................... | 216/46 |
| 5,438,023 A * | 8/1995 | Argos et al. | ...................... | 438/3 |
| 6,530,380 B1 * | 3/2003 | Zhou et al. | ...................... | 134/1.2 |
| 6,756,321 B2 | 6/2004 | Ko et al. | | |
| 7,030,031 B2 | 4/2006 | Wille et al. | | |
| 7,276,441 B1 * | 10/2007 | Cui et al. | ...................... | 438/654 |
| 2003/0021479 A1 * | 1/2003 | Oku | .............................. | 382/200 |
| 2003/0119211 A1 * | 6/2003 | Summerfelt et al. | ............. | 438/3 |
| 2004/0067658 A1 * | 4/2004 | Ko et al. | ...................... | 438/778 |
| 2005/0023694 A1 * | 2/2005 | Bjorkman et al. | ............. | 257/758 |
| 2005/0079701 A1 | 4/2005 | Baks et al. | | |
| 2005/0103748 A1 * | 5/2005 | Yamaguchi et al. | ............ | 216/67 |

FOREIGN PATENT DOCUMENTS

JP 5-341533 12/1993
JP 7-183194 7/1995

\* cited by examiner

*Primary Examiner* — James Mitchell
*Assistant Examiner* — Colleen E Snow
(74) *Attorney, Agent, or Firm* — Young & Thompson

(57) ABSTRACT

An intermediate film 222 in a three-layered resist film 225 is formed by the chemical vapor deposition process at a temperature not higher than 300° C., using $Si(OR_1)(OR_2)(OR_3)(OR_4)$, where each of $R_1$, $R_2$, $R_3$ and $R_4$ independently represents a carbon-containing group or a hydrogen atom, excluding the case where all of $R_1$ to $R_4$ are hydrogen atoms.

28 Claims, 10 Drawing Sheets

200

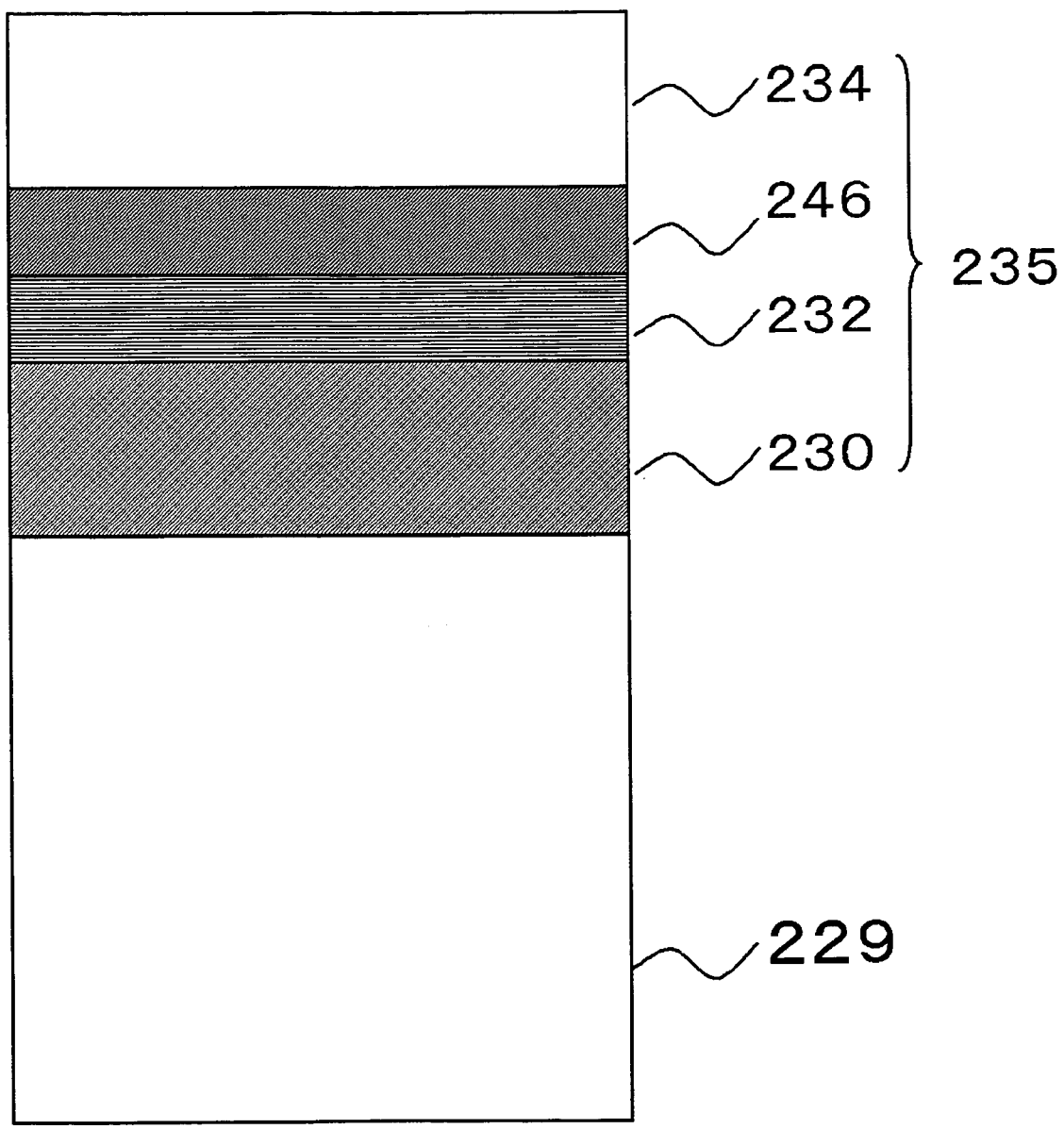

LOW TEMPERATURE TEOS-SiO$_2$ FILM

LOW TEMPERATURE SiH$_4$-SiO$_2$ FILM

METHOD OF FABRICATING A SEMICONDUCTOR DEVICE

This application is based on Japanese patent applications No. 2005-089794 and No. 2004-090575 the content of which are incorporated hereinto by reference.

BACKGROUND OF THE INVENTION

1. Field of the Invention

The present invention relates to a method of fabricating a semiconductor device, by which interconnect trenches and viaholes are formed using the three-layered resist process.

2. Related Art

With advancement in micronization of semiconductor devices, there are increasing demands on micro-fabrication in etching technology using photoresist. The three-layered resist process is known as a method allowing micro-fabrication unsusceptible to step difference on substrates. In the three-layered resist process, first, a thick lower resist film is coated on a substrate to be micro-fabricated. Next, SOG (spin-on-glass) is coated on the lower resist film to thereby form an intermediate film. Further thereon, an upper resist film is coated, the upper resist film is subjected to light exposure, and developed to thereby obtain a mask used for the processing (Japanese Laid-Open Patent Publication No. H5-341533).

When any misalignment should occur, it is general to peel off or remove only the upper resist film by $O_2$ ashing or by using an organic solvent, and to form the upper resist film again, which is followed by light exposure and development. The removal of the upper resist film using an organic solvent has, however, also resulted in peeling off of SOG composing the intermediate film. Japanese Laid-Open Patent Publication No. H5-341533 also discloses a technique of using a low concentration resolution resist, in order to make only the upper resist film more readily removable.

Japanese Laid-Open Patent Publication No. H7-183194 discloses a technique of using a $SiO_2$ film formed by the low-temperature, high-density-plasma CVD process as the intermediate film of the three-layered resist, in order to improve critical dimension loss during etching of the lower resist film, and to improve geometry of the pattern.

The conventional peeling off and removal of the upper resist film by $O_2$ ashing has been known to promote bonding of C and O in SOG during the ashing, and to readily destruct $Si\text{---}CH_3$ bonds. Portions where the $Si\text{---}CH_3$ bonds were destructed generate dangling bonds of Si, and this undesirably increases hygroscopicity of the SOG layer. Such moisture absorption of the underlying SOG modifies film properties thereof, and this consequently alters light exposure conditions for the upper resist film, and results in pattern failure. For this reason, it has been believed as being difficult to peel off and remove only the upper resist film and to re-build it in the three-layered resist technique using SOG, and as being poor in the mass productivity.

An $SiO_2$ film formed by using $SiH_4$ gas and $N_2O$ gas, as described in Japanese Laid-Open Patent Publication No. H7-183194, has been found to be unsatisfactory in the ashing resistance as will be described later in Examples.

SUMMARY OF THE INVENTION

The present invention was conceived after considering the above-described situations.

According to the present invention, there is provided a method of fabricating a semiconductor device comprising: forming an insulating film on a film-to-be-etched formed on a semiconductor substrate; forming, on the insulating film, an intermediate film by the chemical vapor deposition process, at a temperature not higher than 300° C., using a compound expressed by the general formula (1) below; forming a resist film on the intermediate film; and etching the film-to-be-etched masked by the insulating film, the intermediate film and the resist film:

[Chemical Formula 1]

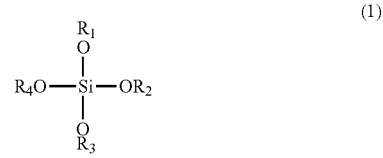

(1)

Each of $R_1$, $R_2$, $R_3$ and $R_4$ herein independently expresses a carbon-containing group or a hydrogen atom. It is to be noted that the case where all of $R_1$ to $R_4$ are hydrogen atoms is excluded. Each of $R_1$, $R_2$, $R_3$ and $R_4$ may independently express an alkyl group having a number of carbon atoms of 1 to 6, or a hydrogen atom.

This makes it possible to form an intermediate film composed of a $SiO_2$ film. Formation of the intermediate film using this sort of material is successful in enhancing ashing resistance of the intermediate film. This makes it possible to prevent the intermediate film from degrading, even when the resist film was found to be misaligned after it was patterned, and so that the resist film had to be removed by ashing.

The lower limit of growth temperature of the intermediate film by the chemical vapor deposition process is typically adjusted to 100° C. or above, although not specifically limited. This makes it possible to remove moisture or organic substances adhered to the substrate from the beginning, and to thereby improve the adhesiveness with the lower layer.

In $Si(OR_1)(OR_2)(OR_3)(OR_4)$ used in the process step of forming the intermediate film in the method of fabricating a semiconductor device of the present invention, each of $R_1$, $R_2$, $R_3$ and $R_4$ may independently express a carbon-containing group. TEOS (tetraethyl orthosilicate) can be used in the process step of forming the intermediate film in the method of fabricating a semiconductor device of the present invention.

Formation of the intermediate film using such material makes it possible to improve ashing resistance of the intermediate film. This is also successful in reducing hygroscopicity of the intermediate film.

In the process step of forming the intermediate film in the method of fabricating a semiconductor device of the present invention, it is allowable to additionally use an oxidative gas.

The oxidative gas applicable herein includes $O_2$ gas, $O_3$ gas and so forth. As the oxidative gas, it is preferable to use gases containing no nitrogen. This is successful in preventing nitrogen-induced resist poisoning from occurring, even when the resist film is formed on the intermediate film using a chemical amplification resist.

In the method of fabricating a semiconductor device of the present invention, the resist film may be composed of a chemical amplification resist. This makes it possible to carry out micro-fabrication of the resist film. Because the intermediate film is formed using a gas containing no nitrogen source as described in the above, it is made possible to avoid nitrogen-source-induced resist poisoning, and thereby to improve the resolution, even when a chemical amplification resist is used for forming the resist film. It is also allowable to configure also the insulating film using a chemical amplification resist without special limitations.

The method of fabricating a semiconductor device of the present invention may further comprise, before forming the intermediate film, forming a first anti-reflection film on the insulating film; and wherein the intermediate film is formed on the first anti-reflection film in the forming the intermediate film.

The preliminary formation of the anti-reflection film under the intermediate film as described in the above makes the intermediate film function as a protective film even when the resist film is re-built after ashing, and this makes it no more necessary to re-build the anti-reflection film. The first anti-reflection film can be configured typically by using SiON.

The method of fabricating a semiconductor device of the present invention may further comprise, before forming the resist film, forming a second anti-reflection film on the intermediate film; and wherein the resist film is formed on the second anti-reflection film in the forming the resist film.

By forming a desired second anti-reflection film between the intermediate film and the resist film as described in the above, it is made possible to improve wetting property of the resist film. The second anti-reflection film can be configured typically by using Novolac resin added with an anti-reflection component.

According to the present invention, it is made possible to raise etching resistance of the intermediate film, when interconnect trenches and viaholes of a semiconductor device are formed using the three-layered resist process.

BRIEF DESCRIPTION OF THE DRAWINGS

The above and other objects, advantages and features of the present invention will be more apparent from the following description taken in conjunction with the accompanying drawings, in which:

FIG. 6 is a structural drawing showing a structure of a semiconductor device according to an embodiment of the present invention;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

FIGS. 1A to 4L are step-wise sectional views showing procedures for fabricating a semiconductor device 200 according to the embodiment of the present invention.

This embodiment will describe an exemplary case where the present invention is applied to formation of a multi-layered wiring structure based on the dual-damascene process. The description herein will be made on a method of forming interconnects/wirings and vias by so-called, via-first process.

Figure 1A:
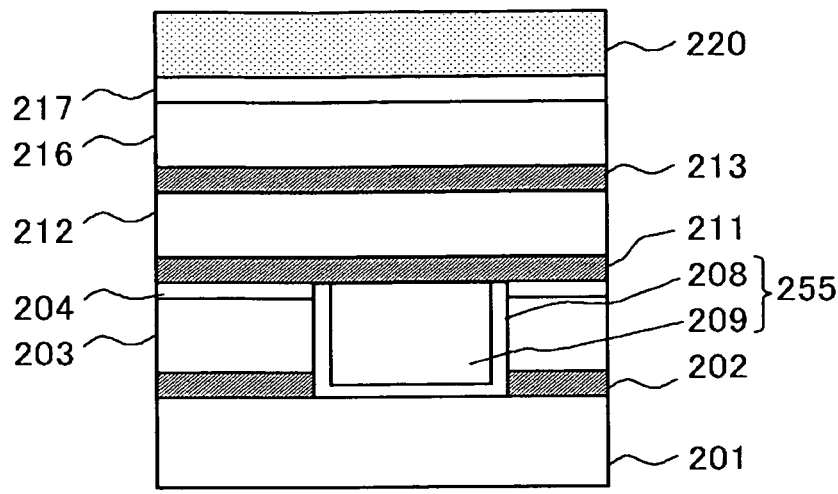
FIGS. 1A to 1C are step-wise sectional views showing procedures for fabricating a semiconductor device according to an embodiment of the present invention.

Procedures up to formation of a multi-layered wiring structure shown in FIG. 1A will be described. First, on an underlying insulating film 201 formed on a semiconductor substrate (not shown), an etching stopper film 202, a first interlayer dielectric film 203, and a first protective film 204 are sequentially stacked. The etching stopper film 202 is typically composed of a SiC film or a SiCN film.

The first interlayer dielectric film 203 can be configured using low-dielectric-constant materials such as polyhydrogen siloxanes such as HSQ (hydrogen silsesquioxane), MSQ (methyl silsesquioxane) and MHSQ (methylated hydrogen silsesquioxane); aromatic-group-containing organic materials such as polyaryl ether (PAE), divinyl siloxane-bis-benzocyclobutene (BCB) and SILK (registered trademark); SOG, FOX (flowable oxide), CYTOP (registered trademark), BCB (benzocyclobutene), and SiOC and so forth. Of these, it is particularly preferable to use materials having SiO structure such as polyhydrogen siloxane and SiOC. It is also allowable to use a porous film of these materials for the first interlayer dielectric film 203. A porous SiOC film or a porous polysiloxane film having a dielectric constant of 2.7 or below can be used as the first interlayer dielectric film 203. The first protective film 204 is typically composed of a $SiO_2$ film. The film-to-be-etched in this embodiment may be any of insulating films such as interlayer dielectric films, protective films, etching stopper films and interlayer dielectric films.

An interconnect trench is then formed in the first interlayer dielectric film 203 and the first protective film 204, and the interconnect trench is filled with a barrier film 208 and an interconnect metal film 209. The barrier film 208 is formed in the interconnect trench by sputtering. The barrier film 208 is configured, for example, by Ta, TaN, Ti, TiN or any stacked structures of these materials. The interconnect metal film 209 is formed on the barrier film 208 typically by electroplating. The interconnect metal film 209 is configured typically using a copper film.

Thereafter, portions of the barrier film 208 and the interconnect metal film 209 formed outside the interconnect trench are then removed by CMP (chemical mechanical polishing), to thereby form a lower interconnect 255.

Next, on the lower interconnect 255, an etching stopper film 211, an interlayer dielectric film 212, an etching stopper film 213, a second interlayer dielectric film 216, and a second protective film 217 are sequentially stacked. After formation of the interlayer dielectric film 212 in the above process, it is preferable to planarize the surface of the interlayer dielectric film 212 by CMP, in order to reduce any irregularity produced during the CMP process in the formation of the lower interconnect 255. This makes it possible to keep planarity of the individual layers even when the multi-layered wiring structure is formed, and to more stably fabricate the semiconductor device. The etching stopper film 211 and the etching stopper film 213 may be formed using a material same with that used for the etching stopper film 202. The interlayer dielectric film 212 and the second interlayer dielectric film 216 may be formed using a material same with that used for the first interlayer dielectric film 203. The second protective film 217 may be formed using a material same with that used for the first protective film 204.

Next, a first resist film 220 is formed on the second protective film 217. A multi-wiring structure having a structure shown in FIG. 1A is thus formed.

The first resist film 220 (approximately 300 to 500 nm thick) may be configured using a material same with that used for the lower resist film generally employed in the three-layered resist process, which is typically a Novolac-base positive photoresist. The first resist film 220 may also be formed using a polyimide resin or thermosetting phenol resin.

Figure 1B:
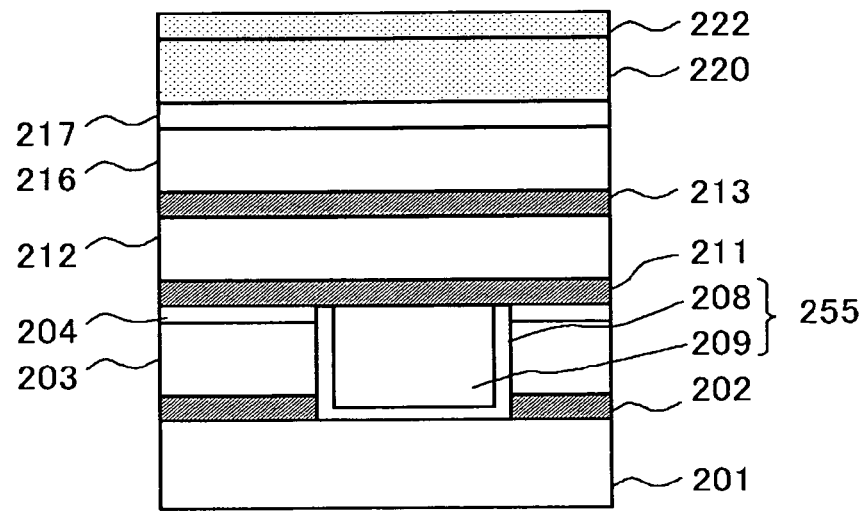

Next, an intermediate film 222 (approximately 50 to 100 nm thick) is formed on the first resist film 220 (FIG. 1B). In this embodiment, the intermediate film 222 is formed typically by using TEOS as a film-forming gas, by the CVD process under a reduced pressure of approximately 3 Torr, at 300° C. or below, more preferably 200° C. or below. The intermediate film 222 may be formed at a temperature of 100° C. or above. The intermediate film 222 may be formed also by the two-frequency plasma CVD process. Adoption of this process successfully suppresses or controls film stress of the intermediate film 222. One frequency in this process can be set to 1 MHz or below. Adoption of this condition is successful in making the intermediate film 222 have compressive stress, even when the intermediate film 222 is formed at a temperature relatively as low as 300° C. or below, and more preferably 200° C. or below. The intermediate film 222 designed to have compressive stress can be reduced in the hygroscopicity of its own. The intermediate film 222 can typically be formed by the two-frequency plasma CVD process using a higher frequency component of 13.56 MHz and a lower frequency component of approximately 500 kHz. The film forming gas adoptable herein may be TEOS, and any additional oxidative gases such as $O_2$.

Figure 1C:
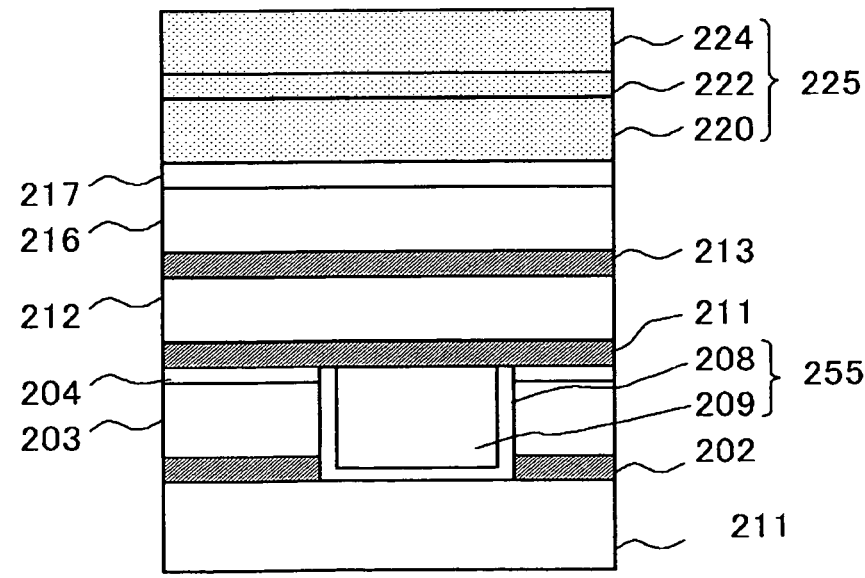

Thereafter, a second resist film 224 (approximately 150 to 300 nm thick) is formed on the intermediate film 222 (FIG. 1C). The second resist film 224 can be configured using a material similar to that generally used for the upper resist film in the three-layered resist process, and is typically a positive chemical amplification resist. A three-layered resist film 225 is thus formed.

Figure 2D:
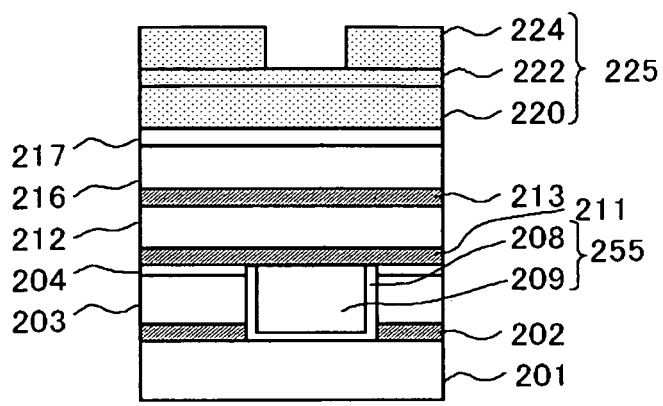
FIGS. 2D to 2G are step-wise sectional views showing procedures for fabricating a semiconductor device according to an embodiment of the present invention.

Next, a viahole is formed in the interlayer dielectric film 212, the second interlayer dielectric film 216, and the second protective film 217, masked by thus-formed three-layered resist film 225. Diameter of the viahole herein can be approximately 0.1 μm. First, the second resist film 224 is patterned to have a predetermined geometry, to thereby form an opening (FIG. 2D). If any misalignment should occur, the second resist film 224 can be removed by $O_2$ ashing (at approximately 250° C.). Because the intermediate film 222 in this embodiment is composed of a material having a large ashing resistance, the ashing will be only less affective to the intermediate film 222. After removal of the second resist film 224, re-formation of the second resist film 224 onto the intermediate film 222 makes it possible to restart the patterning of the second resist film 224.

Figure 2E:
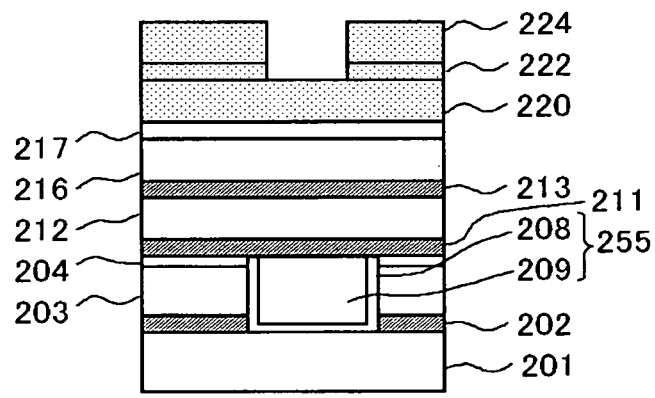
Figure 2F:
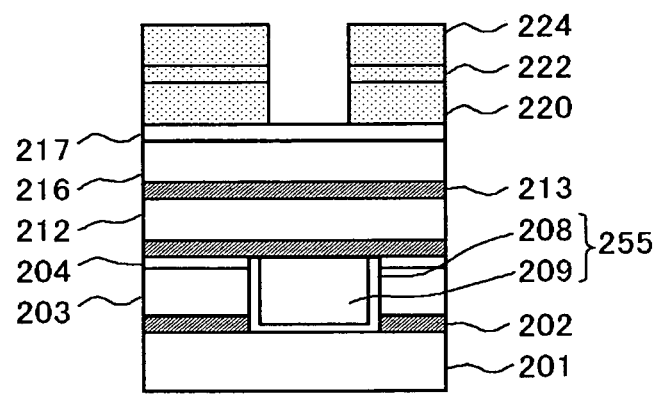

The intermediate film 224, masked by the second resist film 224, is then patterned to have a predetermined geometry, to thereby form an opening (FIG. 2E). Next, the first resist film 220, masked by the second resist film 224 and intermediate film 222, is patterned to have the predetermined geometry, to thereby form an opening (FIG. 2F).

Figure 2G:
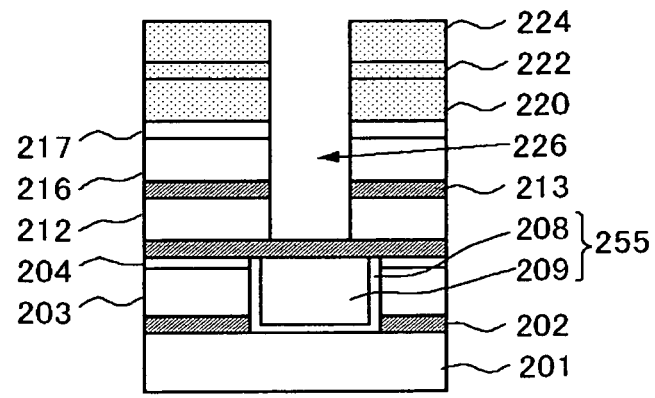

Next, under masking by thus-patterned three-layered resist film 225, a viahole 226 is made in the interlayer dielectric film 212, the etching stopper film 213, the second interlayer dielectric film 216, and the second protective film 217, using a publicly-known lithographic technique and an etching technique (FIG. 2G). The etching stopper film 211 has a function of stopping etching for forming the viahole 226. Although the second resist film 224 and the intermediate film 222 are still shown in the drawing, it is also allowable to configure the second resist film 224 using a material removable in the process of forming the opening in the intermediate film 222, and to configure the intermediate film 222 using a material removable in the process of forming the opening in the first resist film 220. This facilitates removal of the three-layered resist film 225 in the later process step.

Figure 3H:
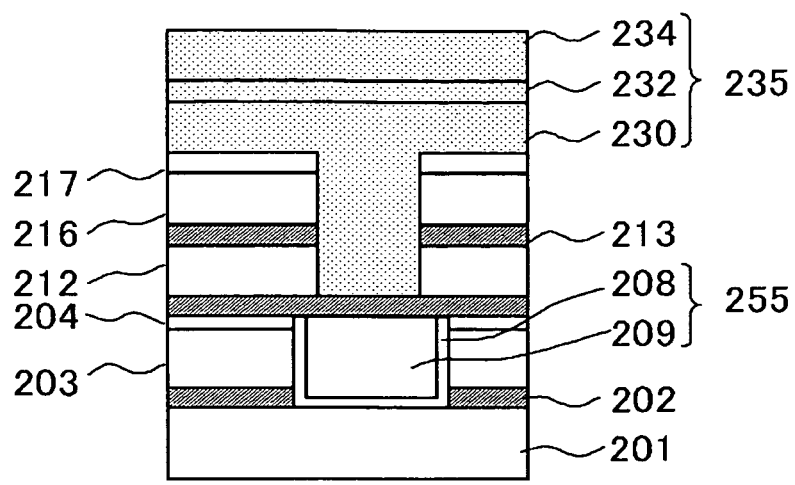
FIGS. 3H to 3J are step-wise sectional views showing procedures for fabricating a semiconductor device according to an embodiment of the present invention.

The three-layered resist film 225 is removed thereafter, and similarly to the case of three-layered resist film 225, a three-layered resist film 235 comprising a third resist film 230, an intermediate film 232 and a fourth resist film 234 is formed (FIG. 3H).

Figure 3I:
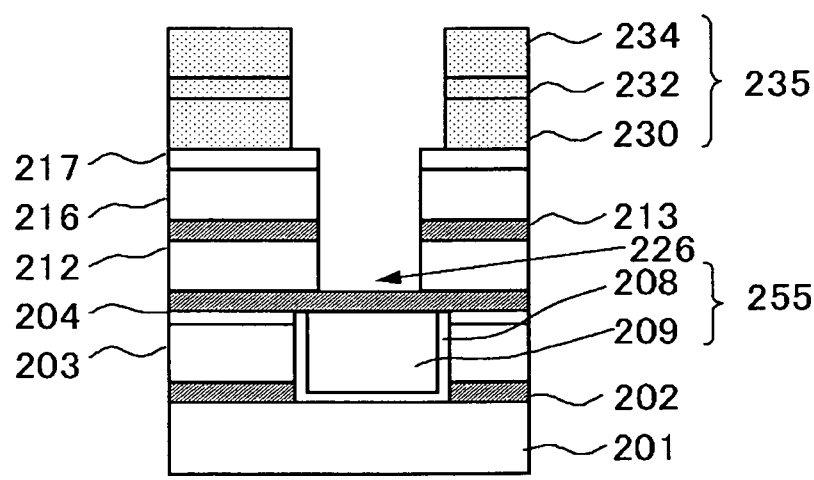

Next, using the three-layered resist film 235, an interconnect trench is formed in the second interlayer dielectric film 216 and the second protective film 217. First, the fourth resist film 234 is patterned to have a predetermined geometry. Next, the intermediate film 232, masked by the fourth resist film 234, is patterned to have a predetermined geometry, to thereby form an opening. Next, the third resist film 230, masked by the fourth resist film 234 and the intermediate film 232, is patterned to have a predetermined geometry, to thereby form an opening (FIG. 3I).

By the way, formation of interconnects and vias according to the via-first process as described in the above have suffered from a problem in that resolution failure of resist (resist poisoning) was likely to occur when the chemical amplification resist was used. This sort of problem is more likely to occur when a low-k film is used as the interlayer dielectric film. The chemical amplification resist comprises a photo-acid generator generating an acid under irradiation of light, and a compound catalyzed by the generated acid, and can form a resist pattern by altering the alkali solubility thereof based on an acid-catalyzed reaction. As for the chemical amplification resist, it is considered that presence of any basic impurities, such as amines, in the lower layer of the resist film may result in resolution failure, possibly by a mechanism such that the acid catalyst generated by irradiating the chemical amplification resist with light is undesirably neutralized by the basic impurities, such as amines, so that the compound in the chemical amplification resist cannot alter its alkali solubility, and therefore the resist film cannot dissolve into an aqueous alkali solution. It is therefore preferable to provide a nitrogen-source-free layer under the chemical amplification resist. In this embodiment, the intermediate film 222 and the intermediate film 232, placed under the second resist film 224 and the fourth resist film 234, respectively, are formed without using nitrogen-containing gas such as $N_2O$, and this raises another effect of improving resolution of the second resist film 224 and the fourth resist film 234.

Figure 3J:
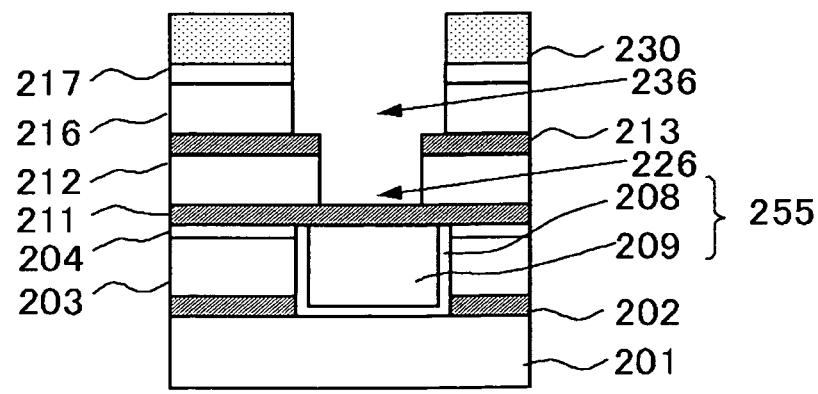

Next, by using the three-layered resist film 235, patterned to have a predetermined geometry as described in the above, as a mask, and by using a publicly-known lithographic technique and an etching technique, a interconnect trench 236 is formed in the second interlayer dielectric film 216 and the second protective film 217 (FIG. 3J). The process results in formation of the viahole 226 and the interconnect trench 236 communicating with each other, on the lower interconnect 255. Also the fourth resist film 234 and the intermediate film 232 are removed in this process.

Figure 4K:
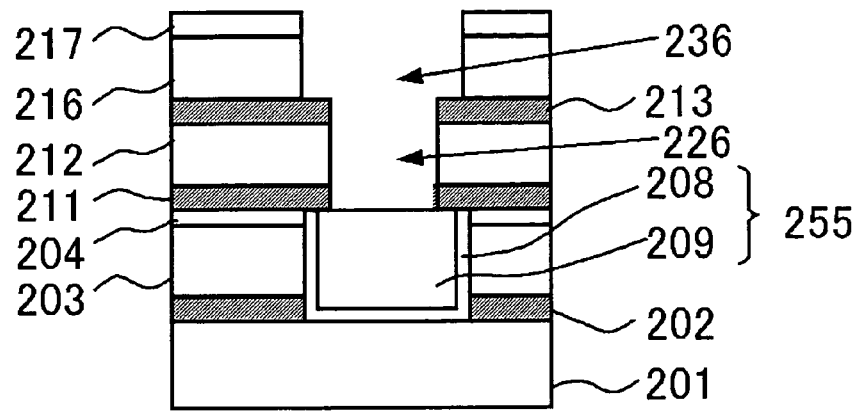
FIGS. 4K and 4L are step-wise sectional views showing procedures for fabricating a semiconductor device according to an embodiment of the present invention.
Figure 4L:
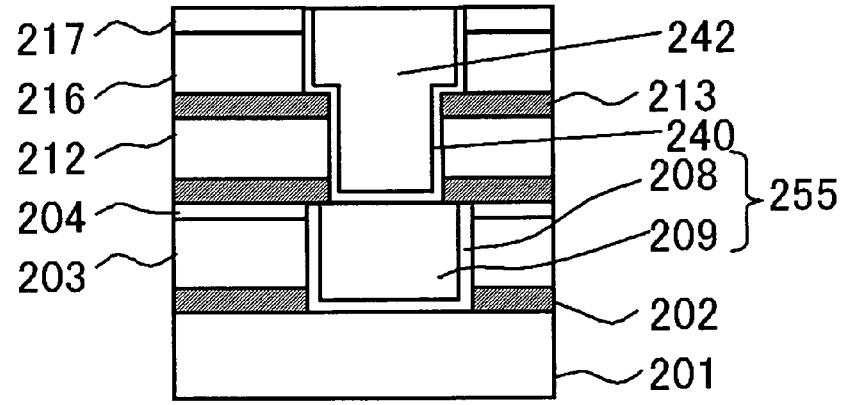

Thereafter, the three-layered resist film 235 used for forming the interconnect trench 236 is completely removed using a release solution, and the etching stopper film 211 exposed at the bottom of the viahole 226 is etched off (FIG. 4K). Next, a barrier film 240 is formed by sputtering in the viahole 226 and the interconnect trench 236. Next, a interconnect metal film 242 is formed, on the barrier film 240, typically by the electroplating process so as to fill the viahole 226 and the interconnect trench 236. Next, portions of the barrier film 240 and the interconnect metal film 242 formed outside the interconnect trench 236 are removed by CMP. The semiconductor device 200 is thus completed.

The semiconductor device having a desired number of layers of multi-layered wiring structure can be fabricated by the dual-damascene process, by repeating the process steps of forming the interconnect, forming thereon the via electrically connecting the interconnect, and further forming the interconnect.

As described in the above, the method of fabricating the semiconductor device 200 of this embodiment is successful in raising the ashing resistance of the intermediate films, because the intermediate film 222 in the three-layered resist film 225, and the intermediate film 232 in the three-layered resist film 235 are formed by the CVD process using TEOS as a source gas. This makes it possible to reduce adverse effect of ashing possibly exerted on the intermediate film 222 or the intermediate film 232 when the second resist film 224 on the intermediate film 222 or the fourth resist film 234 on the intermediate film 232, respectively, is removed by ashing.

Thus-formed intermediate film 222 has a low hygroscopicity, and this raises another advantage of raising stability when the intermediate film 222 or the intermediate film 232 is kept formed and allowed to stand for a while.

The intermediate film 222 or the intermediate film 232, containing no nitrogen source, also makes it possible to suppress resist poisoning and to improve the resolution, even when a chemical amplification resist film is used for the upper second resist film 224 or the fourth film 234, respectively.

For example, a problem of resist poisoning has conventionally arisen for the case where the film-to-be-etched, which comprises the first interlayer dielectric film 203, the interlayer dielectric film 212, the second interlayer dielectric film 216 and so forth, was configured using a porous SiOC film (typically having a dielectric constant of 2.7 or below). This is supposedly because an amine-base releasing solution infiltrated into the porous SiOC film, or a nitrogen source contaminated into the film during plasma treatment can affect the resist film. It was, however, confirmed that the method of fabricating a semiconductor device of the present invention successfully suppressed the resist poisoning even when the first interlayer dielectric film 203, the interlayer dielectric film 212, the second interlayer dielectric film 216 and so forth were configured using the porous SiOC film. This is supposedly because the intermediate film 222 does not contain any nitrogen sources, and because the upper chemical amplification resist was prevented from being affected by the lower film-to-be-etched even when it contains a nitrogen source.

Second Embodiment

Figure 5:
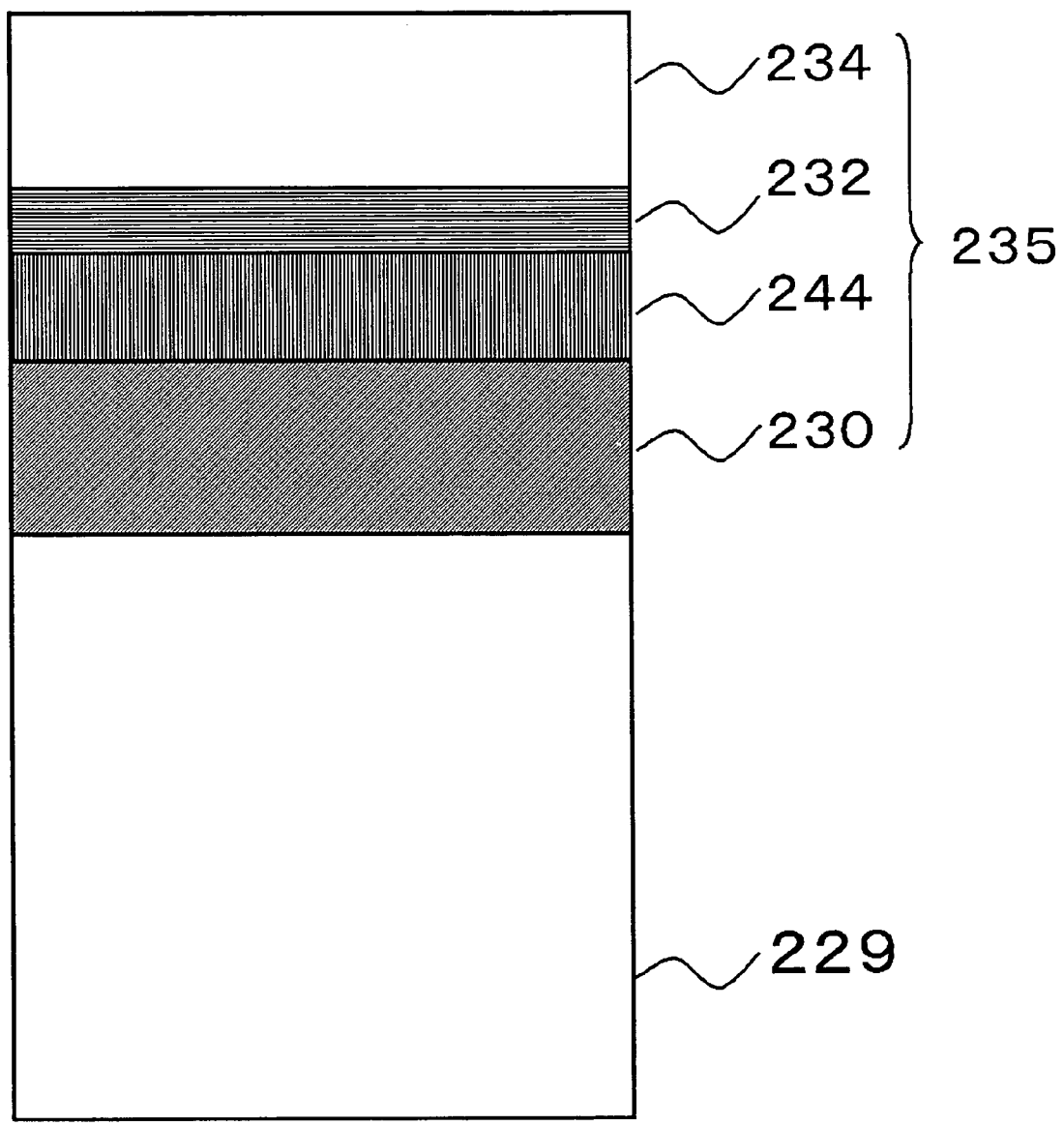
FIG. 5 is a structural drawing showing a structure of a semiconductor device according to an embodiment of the present invention.

FIG. 5 and FIG. 6 are structural drawings respectively showing the semiconductor device 200 according to the embodiment of the present invention. Detailed structure of the lower layers under the three-layered resist film 235 herein is not shown, simply referring to as an object-to-be-etched 229.

As shown in FIG. 5, the three-layered resist film 235 may also be configured as having an anti-reflection film 244 between the third resist film 230 and the intermediate film 232. The anti-reflection film 244 herein may be configured typically using SiON or SiOC. For an exemplary case where the anti-reflection film 244 is configured using SiON, SiON can be formed using $SiH_4$ and $N_2O$ gases at 200° C. or below in a parallel-plate-type plasma CVD apparatus. The anti-reflection film 244 is preferably formed in the same apparatus in which the intermediate film 232 is formed. Enrichment of the Si composition of the anti-reflection film 244 can increase the attenuation coefficient of light. This makes the film less light-transmissible. Also the three-layered resist film 225 can similarly be configured.

As shown in FIG. 6, the three-layered resist film 235 can be configured also as having an anti-reflection film 246 provided between the intermediate film 232 and the fourth resist film 234. The anti-reflection film 246 herein can be configured typically by using a Novolac resin added with an anti-reflection component. This makes it possible to improve wetting property between the fourth resist film 234 and the underlying layer. Also the three-layered resist film 225 can similarly be configured.

The three-layered resist film 235 and/or the three-layered resist film 225 may include both the anti-reflection film 244 and the anti-reflection film 246.

As described in the above, provision of the anti-reflection film in the three-layered resist film 235 and in the three-layered resist film 225 contributes to well-controlled resist patterning.

Example 1

Structural changes in a $TEOS\text{-}SiO_2$ film, a $SiH_4\text{—}SiO_2$ film, and a SOG film before and after ashing were investigated. The individual films were prepared as follows.

i) $TEOS\text{-}SiO_2$ Film

A mixed gas of TEOS and $O_2$ (ratio of flow rate of 1:10) was used as a film forming gas, and the film was formed by the two-frequency plasma CVD process at 200° C. under a reduced pressure of approximately 3 Torr. Output power was adjusted to approximately 100 W for the higher frequency (13.56 MHz), and at approximately 200 W for the lower frequency (approximately 500 kHz).

ii) $SiH_4\text{—}SiO_2$ Film

The film was formed by the CVD process at 200° C., using a mixed gas of $SiH_4$ and $N_2O$ (ratio of flow rate of 1:20), under a reduced pressure of approximately 3 Torr.

iii) SOG Film

A chemical liquid of SOG was dropped through a coater, sintered at approximately 200° C. on a hot plate, to thereby form the film.

Three thus-prepared films were subjected to $O_2$ ashing at approximately 250° C., and were investigated into their changes in FT-IR spectra, rates of change in the film thickness, and rates of change in the refractive indices before and after the ashing.

Figure 7A:
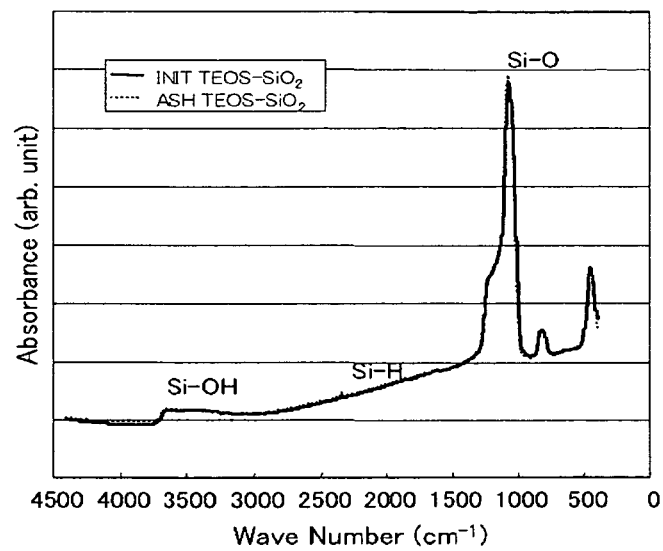
FIGS. 7A to 7C are charts showing changes in FT-IR spectra.
Figure 7B:
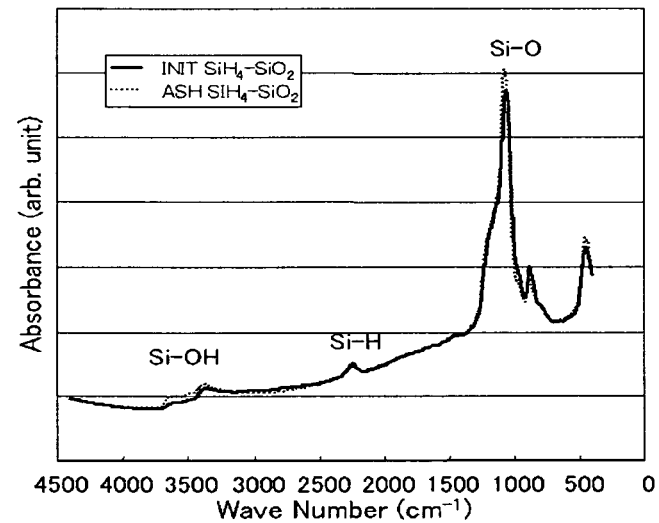
Figure 7C:
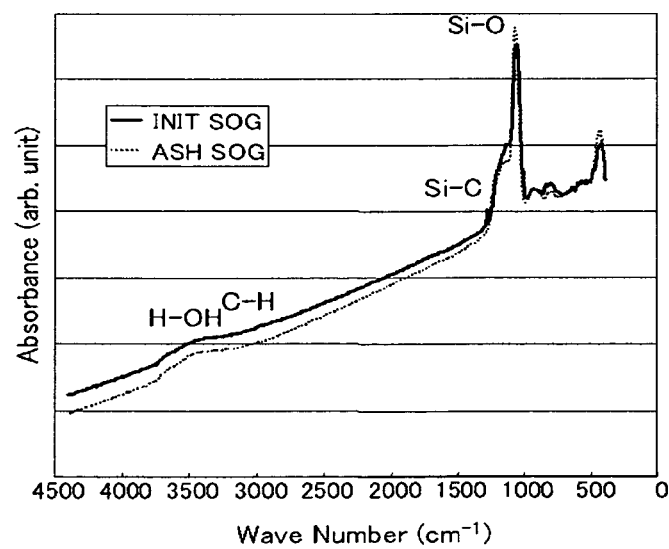

FIGS. 7A to 7C are charts showing changes in the FT-IR spectra. As is obvious from FIG. 7A, the $TEOS\text{-}SiO_2$ showed almost no changes between spectra before ashing (INIT) and after ashing (ASH). As is obvious from FIG. 7B, the $SiH_4$—$SiO_2$ film after ashing showed increase in the Si—OH bond as compared with that before ashing (INIT). As is obvious from FIG. 7C, the ashing of the SOG film resulted in disappearance of $CH_3$ group and increase in H—OH.

Figure 8:
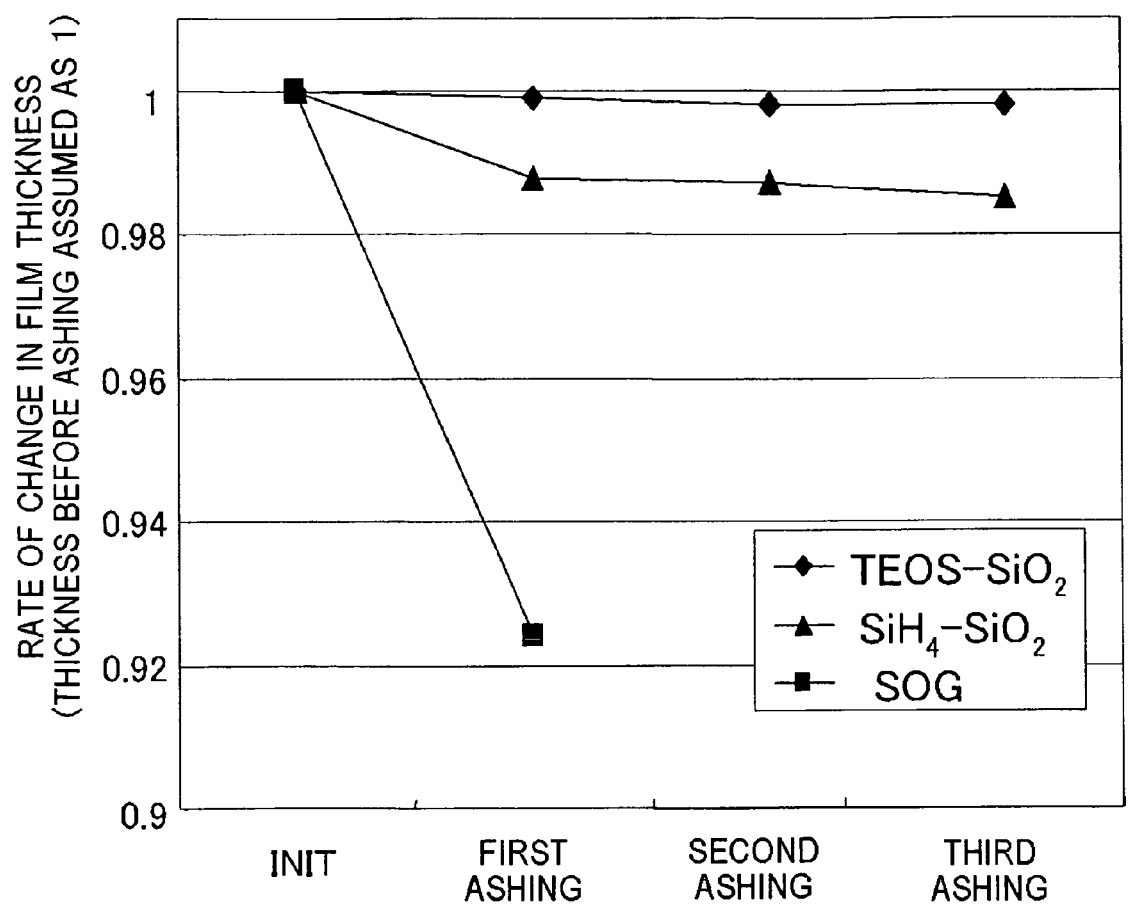
FIG. 8 is a chart showing changes in film thickness.

FIG. 8 is a chart showing changes in the film thickness. Making now reference to the film thickness before ashing, the TEOS-SiO$_2$ film showed almost no changes in the film thickness even after the ashing repeated three times. On the other hand, the SOG film showed a considerable shrinkage of the thickness after only a single time of ashing. As for the SiH$_4$—SiO$_2$ film, although the degree of which was not so considerable as the SOG film showed, it showed changes in the film thickness as compared with the TEOS-SiO$_2$ film. This may be ascribable to brittleness of the film.

Figure 9:
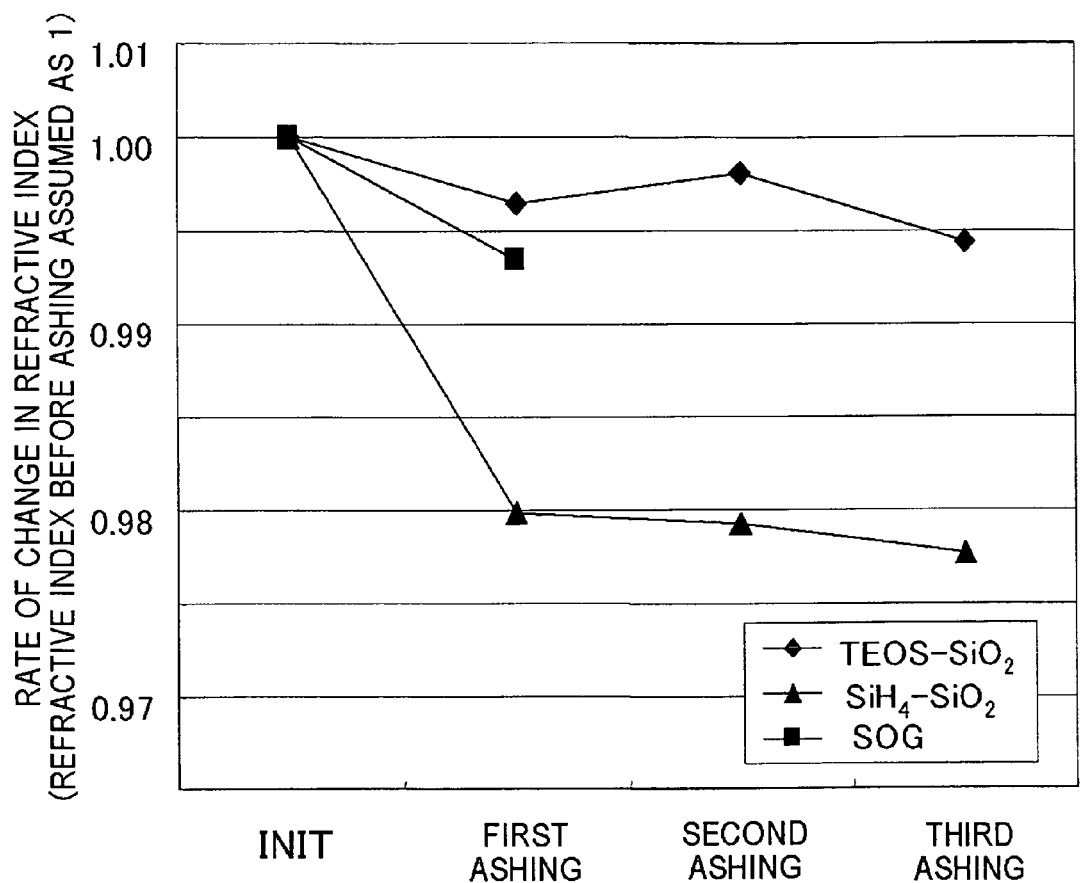
FIG. 9 is a chart showing changes in refractive index.

FIG. 9 is a chart showing changes in the refractive index. Making again reference to the refractive index before ashing, the TEOS-SiO$_2$ film showed almost no changes in the refractive index even after the ashing repeated three times. On the other hand, the SiH$_4$—SiO$_2$ film showed a considerable change in the refractive index after only a single time of ashing. As for the SOG film, although the degree of which was not so considerable as the SiH$_4$—SiO$_2$ film showed, it showed changes in the refractive index as compared with the TEOS-SiO$_2$ film. This may be ascribable to modification of the film quality due to destruction of Si—CH$_3$ bonds.

As described in the above, the TEOS-SiO$_2$ film was proved to show almost no structural changes before and after the ashing, and to show a high resistance against the ashing.

Example 2

Figure 10A:
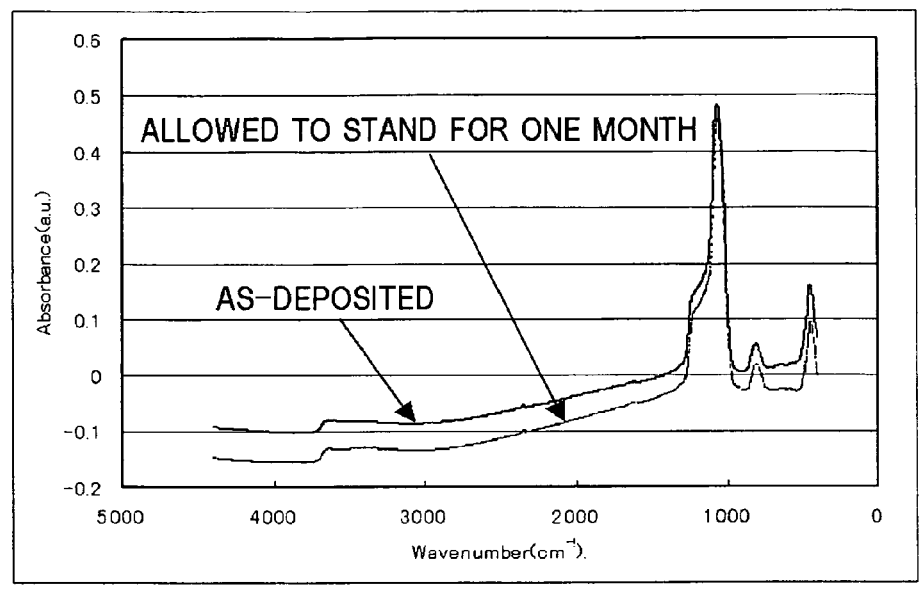
FIGS. 10A and 10B are FT-IR charts.

The TEOS-SiO$_2$ film and the SiH$_4$—SiO$_2$ film formed similarly to as described in Example 1 were kept for one month in a clean room atmosphere (23° C.), and then subjected to the FT-IR measurement. FIG. 10A shows an FT-IR chart for the TEOS-SiO$_2$ film, and FIG. 10B shows an FT-IR chart for the SiH$_4$—SiO$_2$ film.

Figure 10B:
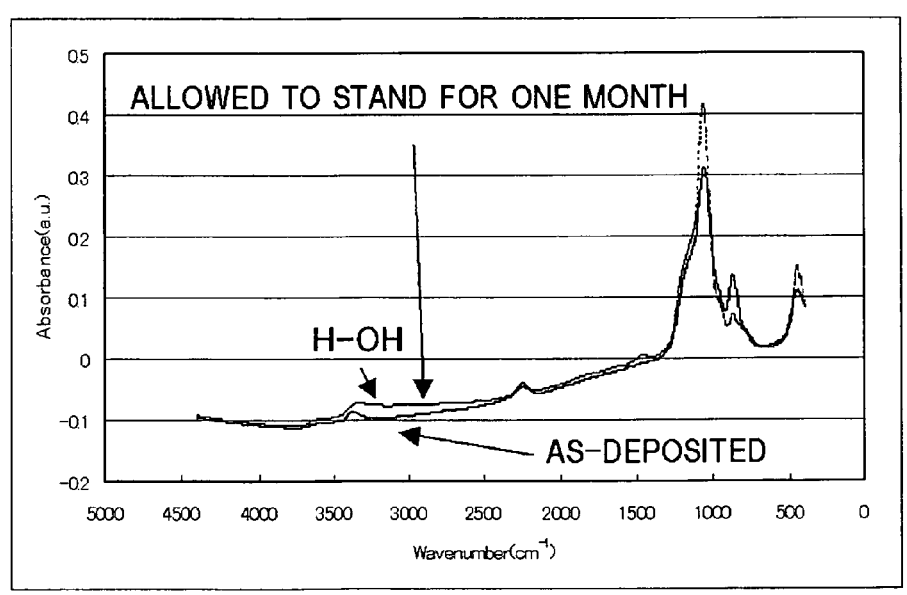

As is obvious from FIG. 10B, H—OH bond appeared in the SiH$_4$—SiO$_2$ film, as compared with the as-deposited film, indicating moisture absorption. On the other hand, the TEOS-SiO$_2$ film showed no peak for H—OH bond even after one month, indicating no moisture absorption. This is supposedly because TEOS, which is a source gas for the TEOS-SiO$_2$ film, has Si bonded to four O atoms, so that also the resultant low-temperature CVD film has a large ratio of content of Si—O bond, ensuring a stable structure. The low-temperature formation of the film may allow existence of Si—H bond, but with only a small ratio of content, so that the film is supposed to remain stable. On the contrary, the SiH$_4$—SiO$_2$ film is supposed to destabilize due to a large content of Si—H bond.

Example 3

The TEOS-SiO$_2$ film was formed similarly to as described in Example 1, and subjected to measurement of film stress at room temperature. The compressive stress was found to be approximately 50 MPa.

In this embodiment, the TEOS-SiO$_2$ film was formed by the two-frequency plasma CVD process, wherein the low frequency component set to as low as 1 MHz or below was supposed to contribute to the well-controlled film stress, by virtue of ion bombardment effect. This was supposed to be successful also in reducing the hygroscopicity.

The present invention has been described based on the embodiments and Examples. It is to be understood by those skilled in the art that the above-described embodiments and Examples are only of exemplary purposes and can be modified in various ways, and that any modifications will be included in the scope of the present invention.

For example, the interconnects and the vias in the above-described embodiments were formed by so-called via-first process of the dual-damascene process, but the present invention is applicable also to various processes including so-called, trench-first process, middle-first process, and even to single-damascene process.

It is apparent that the present invention is not limited to the above embodiments, that may be modified and changed without departing from the scope and spirit of the invention.

What is claimed is:

1. A method of fabricating a semiconductor device comprising:
    forming a first interconnect on a semiconductor substrate;
    forming a film-to-be-etched on said first interconnect;
    forming a via hole in said film-to-be etched;
    forming an organic film on said film-to-be-etched;
    forming, on said organic film, an intermediate film by a two frequency chemical vapor deposition process, at a temperature of 100° C. or above to 300° C. or below, using a compound expressed by the general formula (1) below;
    forming a resist film having a pattern for an opening on said intermediate film;
    etching said film-to-be-etched by utilizing said organic film, said intermediate film and said resist film to form a trench in said film-to-be-etched; and
    forming a second interconnect connected to said first interconnect by filling said trench and said via hole with metal:

[Chemical Formula 1]

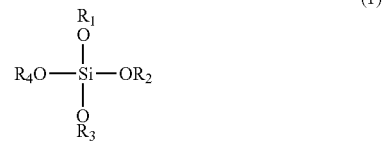

(1)

where each of R$_1$, R$_2$, R$_3$ and R$_4$ independently expresses a carbon-containing group or a hydrogen atom, excluding the case where all of R$_1$ to R$_4$ are hydrogen atoms.

2. The method of fabricating a semiconductor device according to claim 1, wherein in said compound in said forming said intermediate film, each of R$_1$, R$_2$, R$_3$ and R$_4$ independently expresses a carbon-containing group.

3. The method of fabricating a semiconductor device according to claim 2, wherein said carbon-containing group is an alkyl group having a number of carbon atoms of 1 to 6.

4. The method of fabricating a semiconductor device according to claim 2, wherein an oxidative gas is additionally used in forming said intermediate film.

5. The method of fabricating a semiconductor device according to claim 1, wherein said carbon-containing group is an alkyl group having a number of carbon atoms of 1 to 6.

6. The method of fabricating a semiconductor device according to claim 5, wherein an oxidative gas is additionally used in forming said intermediate film.

7. The method of fabricating a semiconductor device according to claim 1, wherein TEOS (tetraethyl orthosilicate) is used in forming said intermediate film.

8. The method of fabricating a semiconductor device according to claim 7, wherein an oxidative gas is additionally used in forming said intermediate film.

9. The method of fabricating a semiconductor device according to claim 7, wherein said resist film is composed of a chemical amplification resist.

10. The method of fabricating a semiconductor device according to claim 7, wherein in said forming said intermediate film, said intermediate film is formed by the two-frequency plasma chemical vapor deposition process using one frequency of 1 MHz or below.

11. The method of fabricating a semiconductor device according to claim 1, wherein an oxidative gas is additionally used in forming said intermediate film.

12. The method of fabricating a semiconductor device according to claim 1, wherein said resist film is composed of a chemical amplification resist.

13. The method of fabricating a semiconductor device according to claim 1, further comprising, before forming said intermediate film, forming an anti-reflection film on said organic film; and wherein said intermediate film is formed on said anti-reflection film in said forming said intermediate film.

14. The method of fabricating a semiconductor device according to claim 13, wherein anti-reflection films are respectively formed on both the organic film and the intermediate film.

15. The method of fabricating a semiconductor device according to claim 1, further comprising,
before forming said resist film, forming an anti-reflection film on said intermediate film; and wherein said resist film is formed on said anti-reflection film in said forming said resist film.

16. The method of fabricating a semiconductor device according to claim 1, wherein said intermediate film is formed to have compressive stress.

17. The method of fabricating a semiconductor device according to claim 1, wherein said film-to-be-etched includes a porous film having a dielectric constant of 2.7 or below.

18. The method of fabricating a semiconductor device according to claim 1, wherein the temperature is 200° C. to 300° C.

19. The method of fabricating a semiconductor device according to claim 1, wherein the chemical vapor deposition process is performed at two frequencies of 13.56 MHz and approximately 500 kHz.

20. The method of fabricating a semiconductor device according to claim 1, wherein the intermediate film has a compressive stress of 50 MPa.

21. The method of fabricating a semiconductor device according to claim 1, wherein the two frequencies include a higher frequency and a lower frequency.

22. The method of fabricating a semiconductor device according to claim 1, wherein said organic film is a resist film.

23. A method of fabricating a semiconductor device comprising:
forming a first interconnect on a semiconductor substrate;
forming a film-to-be-etched on said first interconnect;
forming a first organic film on said film-to-be-etched;
forming, on said first organic film, a first intermediate film by a two frequency chemical vapor deposition process, at a temperature of 100° C. or above to less than 300° C., using a compound expressed by the general formula (I) below;
forming a first resist film having a pattern for a first opening on said first intermediate film;
etching said film-to-be-etched by utilizing said first organic film, said first intermediate film and said first resist film to form a via hole in said film-to-be-etched;
removing said first organic film, said first intermediate film and said first resist film;
forming a second organic film on said film-to-be-etched with burring said via hole with said second organic film;
forming, on said second organic film, a second intermediate film by a two frequency chemical vapor deposition process, at a temperature of 100° C. or above to 300° C. or below, using a compound expressed by the general formula (I) below;
forming a second resist film having a pattern for a second opening on said second intermediate film;
etching said film-to-be-etched by using said second organic film, said second intermediate film and said second resist film to form a trench in said film-to-be-etched; and
forming a second interconnect connected to said first interconnect by filling said trench and said via hole with metal:

[Chemical Formula 1]

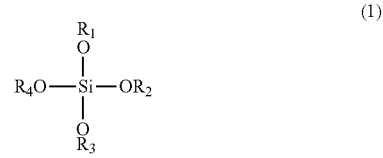

(1)

where each of $R_1$, $R_2$, $R_3$ and $R_4$ independently expresses a carbon-containing group or a hydrogen atom, excluding the case where all of $R_1$ to $R_4$ are hydrogen atoms.

24. The method of fabricating a semiconductor device according to claim 23, wherein the two frequencies include a higher frequency and a lower frequency.

25. The method of fabricating a semiconductor device according to claim 23, wherein the two frequency chemical vapor deposition process is performed at 13.56 MHz and approximately 500 kHz.

26. The method of fabricating a semiconductor device according to claim 23, wherein said organic film is a resist film.

27. A method of fabricating a semiconductor device comprising:
forming a first interconnect on a semiconductor substrate;
forming a film-to-be-etched on said first interconnect;
forming an organic film on said film-to-be-etched;
forming, on said organic film, an intermediate film by a two frequency chemical vapor deposition process, at a temperature of 100° C. or above to 300° C. or below, using a compound expressed by the general formula (1) below;
forming a resist film having a pattern for an opening on said intermediate film;
etching said film-to-be-etched by utilizing said organic film, said intermediate film and said resist film to form a via hole in said film-to-be etched;
forming a trench on said via hole in said film-to-be-etched; and
forming a second interconnect connected to said first interconnect by filling said trench and said via hole with metal:

[Chemical Formula 1]

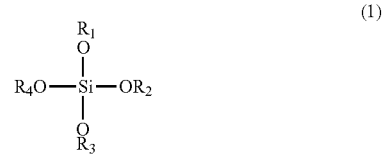

(1)

where each of $R_1$, $R_2$, $R_3$ and $R_4$ independently expresses a carbon-containing group or a hydrogen atom, excluding the case where all of $R_1$ to $R_4$ are hydrogen atoms.

28. The method of fabricating a semiconductor device according to claim 27, wherein said organic film is a resist film.

\* \* \* \* \*